United States Patent
Lee et al.

(10) Patent No.: US 9,146,324 B2
(45) Date of Patent: Sep. 29, 2015

(54) SCINTILLATOR, METHOD OF FABRICATING THE SAME AND X-RAY DETECTOR INCLUDING THE SCINTILLATOR

(71) Applicant: Samsung Display Co., Ltd., Yongin, Gyeonggi-do (KR)

(72) Inventors: Kyung Soo Lee, Yongin (KR); Jang Won Moon, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 95 days.

(21) Appl. No.: 13/966,143

(22) Filed: Aug. 13, 2013

(65) Prior Publication Data

US 2014/0070105 A1    Mar. 13, 2014

(30) Foreign Application Priority Data

Sep. 11, 2012  (KR) .................. 10-2012-0100549

(51) Int. Cl.
| | |
|---|---|
| *G01T 1/20* | (2006.01) |
| *C30B 29/60* | (2006.01) |
| *C09K 11/77* | (2006.01) |
| *C09K 11/61* | (2006.01) |
| *G01T 1/202* | (2006.01) |
| *C30B 23/00* | (2006.01) |
| *C30B 23/06* | (2006.01) |
| *C30B 29/12* | (2006.01) |
| *C30B 29/46* | (2006.01) |
| *H05B 33/10* | (2006.01) |

(52) U.S. Cl.
CPC .............. *G01T 1/2002* (2013.01); *C09K 11/616* (2013.01); *C09K 11/7701* (2013.01); *C30B 23/002* (2013.01); *C30B 23/063* (2013.01); *C30B 23/066* (2013.01); *C30B 29/12* (2013.01); *C30B 29/46* (2013.01); *C30B 29/605* (2013.01); *G01T 1/202* (2013.01); *G01T 1/2006* (2013.01); *G01T 1/2023* (2013.01); *H05B 33/10* (2013.01)

(58) Field of Classification Search
CPC ..................................................... G01T 1/2002
See application file for complete search history.

(56) References Cited

U.S. PATENT DOCUMENTS

| | | | |
|---|---|---|---|
| 7,432,509 B2 | 10/2008 | Mori et al. | |
| 2004/0042585 A1 | 3/2004 | Nagarkar et al. | |
| 2011/0006213 A1 | 1/2011 | Sato et al. | |
| 2012/0205543 A1* | 8/2012 | Nakatsugawa et al. | 250/366 |

FOREIGN PATENT DOCUMENTS

KR   10-2010-0043818 A   4/2010

\* cited by examiner

*Primary Examiner* — Constantine Hannaher
(74) *Attorney, Agent, or Firm* — Knobbe Martens Olson & Bear LLP

(57) ABSTRACT

A scintillator, which can prevent a data error due to light diffusion or spreading by improving light collimation, a method of fabricating the same and an X-ray detector including the scintillator are disclosed. The scintillator includes a substrate and a scintillator layer formed on the substrate and having columnar crystals and non-columnar crystals, wherein each of the columnar crystals has an aspect ratio of 80:1 or greater.

18 Claims, 6 Drawing Sheets

SCINTILLATOR, METHOD OF FABRICATING THE SAME AND X-RAY DETECTOR INCLUDING THE SCINTILLATOR

CROSS-REFERENCE TO RELATED APPLICATIONS

This application claims priority from Korean Patent Application No. 10-2012-0100549 filed on Sep. 11, 2012 in the Korean Intellectual Property Office, the disclosure of which is incorporated herein by reference in its entirety.

BACKGROUND

1. Field

The present disclosure relates to a scintillator, a method of fabricating the same, and an X-ray detector including the scintillator.

2. Description of the Related Technology

An X-ray detection system is a system that transmits X-rays through an object, e.g., human body, and detects the amount of the transmitted X-rays to photograph the interior of the object. The X-ray detection system may be generally used as a medical testing device and a non-destructive testing device.

In early days, a film or computed radiography (CR) was used in X-ray photography systems for taking an X-ray photograph. In recent years, X-ray photography systems have employed a digital radiography (DR) method for taking X-ray photographs because of convenience in use.

The X-ray detection system based on the DR method, which includes a scintillator, indirectly measures the amount of detected X-rays by converting irradiated X-rays into visible light and allowing a photoelectric conversion element provided in each pixel to convert the visible light into an electrical signal. Using this method, when the visible light transmitted from the scintillator is diffused or spreads and is transmitted to a neighboring pixel, a data error in the amount of detected X-rays may be generated.

SUMMARY OF THE INVENTION

The present disclosure describes a scintillator, which can prevent data errors due to light diffusion or spreading by improving light collimation.

The present disclosure also describes a method of fabricating a scintillator, which can prevent data errors due to light diffusion or spreading by improving light collimation.

The present disclosure also describes an X-ray detector, which can prevent data errors due to light diffusion or spreading by improving light collimation.

The above and other objects will be described in or be apparent from the following description of the some exemplary embodiments.

Some embodiments herein describe a scintillator comprising a substrate; and a scintillator layer formed on the substrate, the scintillator layer having columnar crystals and non-columnar crystals, wherein each of the columnar crystals has an aspect ratio of 80:1 or greater.

In some embodiments, 70% or greater of the plurality of columnar crystals have an aspect ratio of 100:1 or greater.

In some embodiments, the scintillator layer includes a seed portion adjacent to the substrate and a growth portion adjacent to the seed portion.

In some embodiments, each of the columnar crystals which extends in the seed portion and the growth portion has a smaller diameter in the seed portion than in the growth portion.

In some embodiments, the diameter of a majority of the columnar crystals in the seed portion is about 0.8 to 0.9 times that the diameter of columnar crystals in the growth portion.

In some embodiments, a height of the seed portion comprises about 5 to 20% of the entire height of the scintillator layer.

In some embodiments, the seed portion comprises primarily columnar crystals and the seed portion comprises columnar and non-columnar crystal.

Some embodiments describe a method of fabricating a scintillator, the method comprising preparing a substrate; and forming a scintillator layer formed on the substrate, the substrate having columnar crystals and non-columnar crystals, wherein each of the columnar crystals has an aspect ratio of 80:1 or greater.

In some embodiments, 70% or greater of the columnar crystals have an aspect ratio of 100:1 or greater.

In some embodiments, the forming of the scintillator layer comprises forming a seed portion on the substrate and then forming a growth portion on the seed portion.

In some embodiments, a majority of the columnar crystals has a smaller diameter in the seed portion than in the growth portion.

Some embodiments describe a method of fabricating a scintillator, comprising preparing a substrate; placing a source material into a crucible containing; forming a seed portion on the substrate at a first super-cooling degree; and forming a growth portion on the seed portion at a second super-cooling degree which is lower than the first super-cooling degree.

In some embodiments, forming of the seed portion and forming of the growth portion comprise evaporating the source material from the crucible, and condensing the source material on the substrate.

In some embodiments, forming of the seed portion is performed at a first substrate temperature and a first crucible temperature, and the forming of the growth portion is performed at a second substrate temperature, which is higher than the first substrate temperature, and at a second crucible temperature, which is lower than the first crucible temperature.

In some embodiments, the method further comprises evaporating the source material to form the growth portion for approximately 4 to 20 times longer than evaporating the source material to form the seed portion.

Some embodiments describe a method of fabricating a scintillator, the method comprising preparing a substrate; placing a source material into a crucible; depositing the source material on the substrate at a first substrate temperature and a first crucible temperature; and subsequently, depositing the source material on the substrate at a second substrate temperature, which is higher than the first substrate temperature, and at a second crucible temperature, which is lower than the first crucible temperature.

Some embodiments describe an X-ray detector comprising an X-ray receiving portion including a plurality of light sensing pixels; a data detector configured to detect an electrical signal transmitted from the X-ray receiving portion; and a scintillator disposed on the X-ray receiving portion, the scintillator comprising a substrate and a scintillator layer formed on the substrate the scintillator having columnar crystals and non-columnar crystals, wherein each of the columnar crystals has an aspect ratio of 80:1 or greater.

In some embodiments, 70% or greater of the columnar crystals have an aspect ratio of 100:1 or greater.

In some embodiments, the scintillator layer includes a seed portion adjacent to the substrate and a growth portion adjacent to the seed portion.

In some embodiments, each of the columnar crystals which extends through the seed portion and the growth portion, and has a smaller diameter in the seed portion than in the growth portion.

In some embodiments, each of the light sensing pixels includes a photoelectric conversion element and first ends of the columnar crystals are disposed adjacent to the photoelectric conversion elements.

Additional aspects and/or advantages of the invention will be set forth in part in the description which follows and, in part, will be apparent from the description.

BRIEF DESCRIPTION OF THE DRAWINGS

The above and other features and advantages of the present disclosure will become more apparent by describing in detail embodiments thereof with reference to the attached drawings.

DETAILED DESCRIPTION OF ILLUSTRATIVE EMBODIMENTS

Advantages and features of the present invention and methods of accomplishing the same may be understood more readily by reference to the following detailed description of embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art.

It will be understood that when an element or layer is referred to as being "on", another element or layer, it can be directly on the other element or layer or intervening elements or layers may be present. Like numbers refer to like elements throughout.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Hereinafter, embodiments of the present disclosure will be described with reference to the accompanying drawings.

Figure 1:
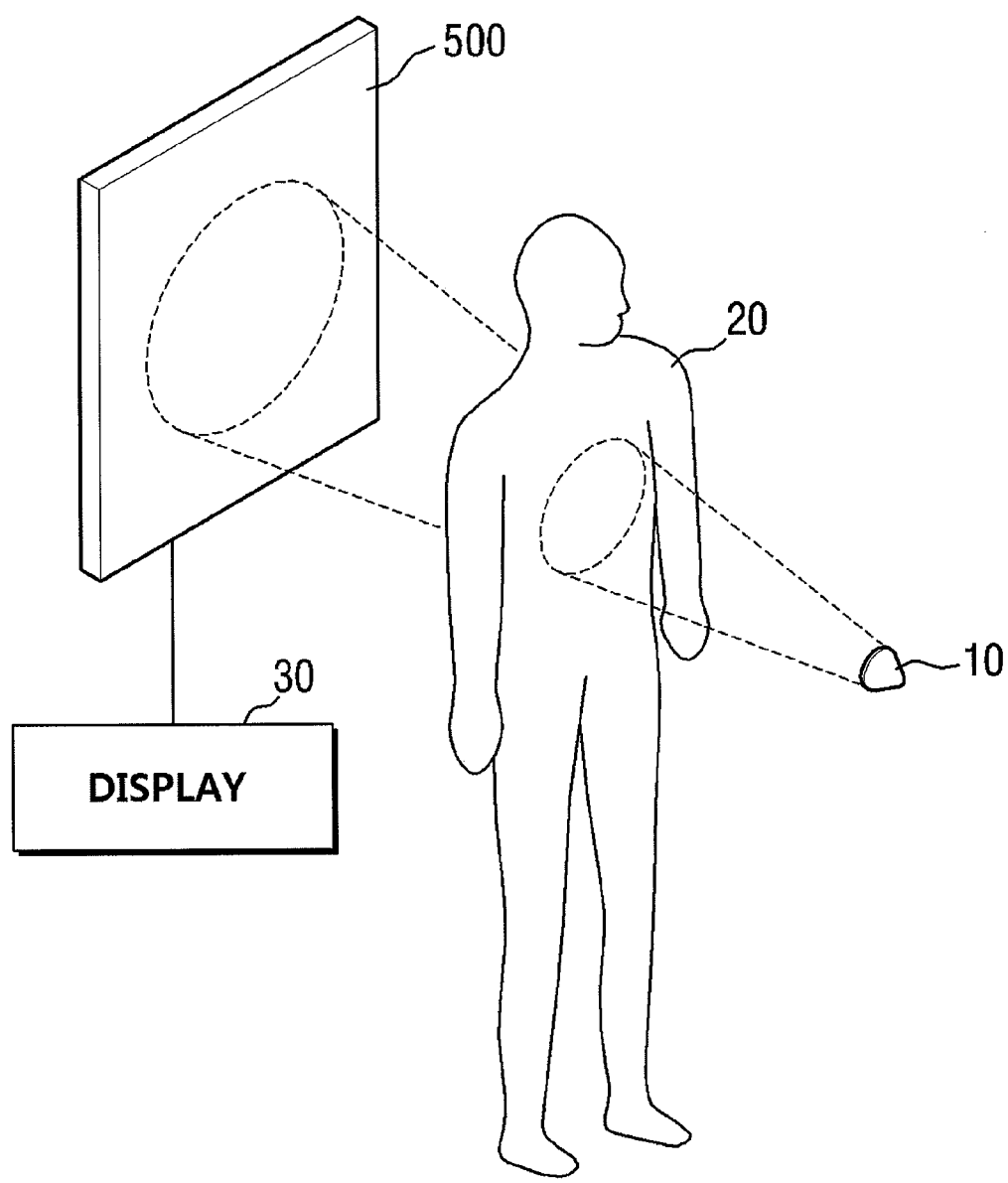
FIG. 1 is a schematic diagram illustrating a method for detecting X-rays using an X-ray detector.

FIG. 1 is a schematic diagram illustrating a method for detecting X-rays using an X-ray detector according to an embodiment of the present invention.

Referring to FIG. 1, X-rays are emitted from an X-ray source 10, transmitted through a subject 20 and are then incident on the X-ray detector 500. The X-ray detector 500 includes a scintillator (not shown) installed to convert the incident X-rays into visible light. The converted visible light is changed into an electrical signal through a photoelectric conversion element, such as a photo diode, provided in the X-ray detector 500. The changed electrical signal is detected and input to a display 30 to display an X-ray image.

Figure 2:
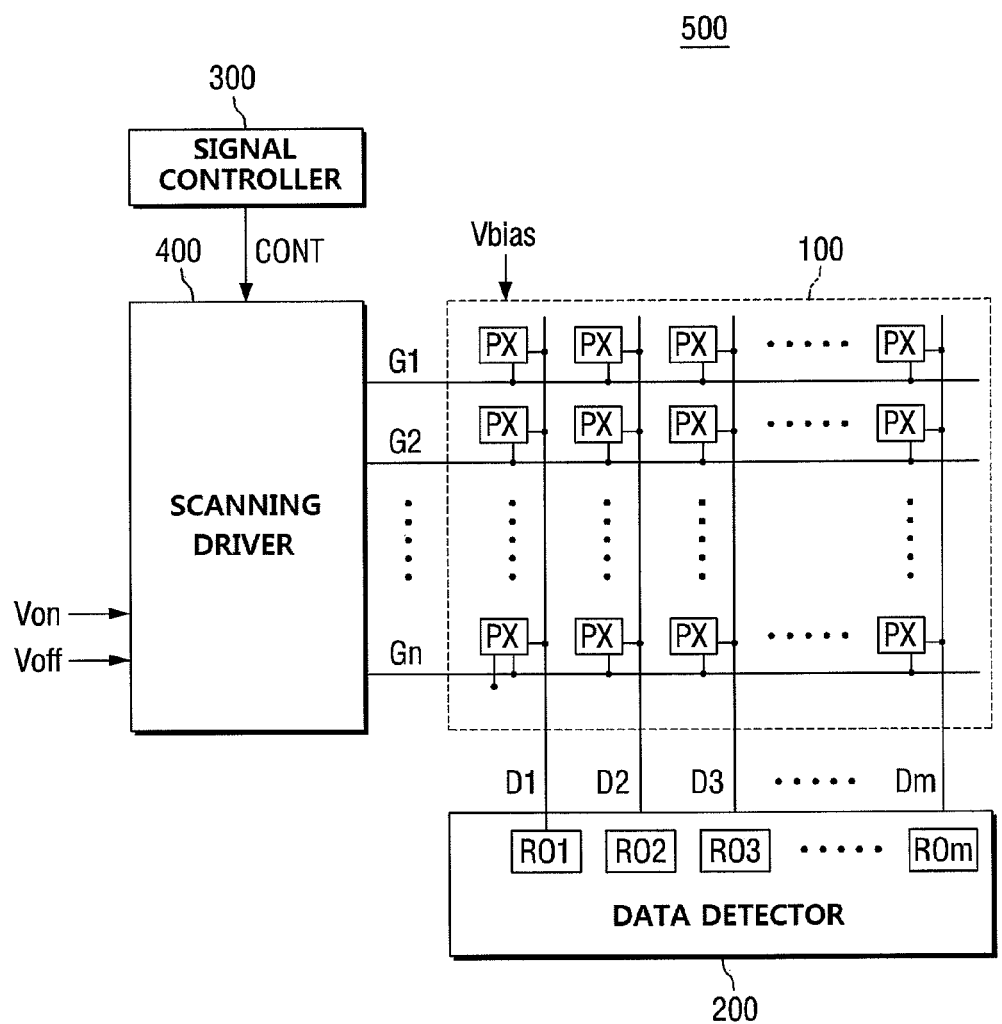
FIG. 2 is a schematic diagram of an X-ray detector.
Figure 3:
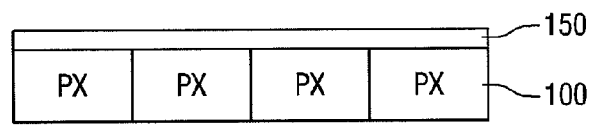
FIG. 3 is a schematic sectional view of the X-ray detector shown in FIG. 2.

FIG. 2 is a schematic diagram of an X-ray detector and FIG. 3 is a schematic sectional view of the X-ray detector shown in FIG. 2.

As shown in FIG. 2, the X-ray detector 500 may include an X-ray receiving portion 100, a scintillator 150, a data detector 200, a signal controller 300 and a scanning driver 400.

The X-ray receiving portion 100 may include a plurality of scanning lines G1~Gn, a plurality of data lines D1~Dm and a plurality of light sensing pixels PXs. The plurality of light sensing pixels PXs may be connected to the signal lines G1~Gn and D1~Dm to be arrayed in a matrix configuration. The scanning lines G1~Gn extend in a row direction and are substantially parallel to each other, and the data lines D1~Dm extend in a column direction and are substantially parallel to each other. A bias voltage Vbias required for operation of each of the plurality of light sensing pixels PXs may be applied to the X-ray receiving portion 100.

The scintillator 150, which converts an X-ray into visible light, is formed on the X-ray receiving portion 100. The scintillator 150 may be formed of cesium iodide (CsI), sodium iodide (NaI), lithium fluoride (LiF), gadolinium oxysulfide (GOS), or the like.

The visible light converted in the scintillator 150 is transmitted to the light sensing pixels PXs of the X-ray receiving portion 100, which are positioned under the scintillator 150. In order to implement an accurate image, the visible light converted in the scintillator 150 is preferably transmitted to the light sensing pixels PXs positioned immediately under the scintillator 150. If the visible light produced in the scintillator 150 is transmitted to a pixel other than the light sensing pixels PX positioned immediately under the scintillator 150, such as to an adjacent light sensing pixel PX, data errors may occur. Therefore, as will be described, the scintillator 150 is configured to transmit the converted visible light to the light sensing pixels PX positioned immediately under the same without being diffused or spreading to other pixels PX.

The signal controller 300 generates a scan driving signal CONT in response to a signal supplied from an external device. The scan driving signal CONT controls the operation of the scanning driver 400. The signal controller 300 supplies the generated scan driving signal CONT to the scanning driver 400.

The scanning driver 400 is connected to the plurality of scanning lines G1~Gn of the X-ray receiving portion 100, generates a plurality of scanning signals composed of combinations of a gate-on voltage, Von, that turns on a switching transistor or a gate-off voltage, Voff, that turns off the switching transistor according to the scan driving signal CONT, and applies the generated scanning signals to the plurality of scanning lines G1~Gn. The plurality of scanning signals control data signal outputs in the X-ray receiving portion 100.

The data detector 200 includes read-out portions RO1~Rom connected to the data lines D1~Dm of the X-ray receiving portion 100, respectively. The respective read-out portions RO1~Rom may receive and read the current transmitted from the light sensing pixels PXs of the X-ray receiving portion 100 through the respective data linens D1~Dm and may generate digital data signals.

Each of various drivers, such as the signal controller 300, the scanning driver 400 and the data detector 200, may be directly mounted on the X-ray receiving portion 100 in the form of at least one integrated circuit chip. In another embodiment, the driver may be mounted on a flexible printed circuit film (not shown), may be attached to an X-ray receiving portion in the form of a tape carrier package (TCP), or may be mounted on a separate printed circuit board) (not shown). In still another embodiment, the drivers may be integrated into the X-ray receiving portion 100 together with the signal lines G1~Gn and D1~Dm.

Figure 4:
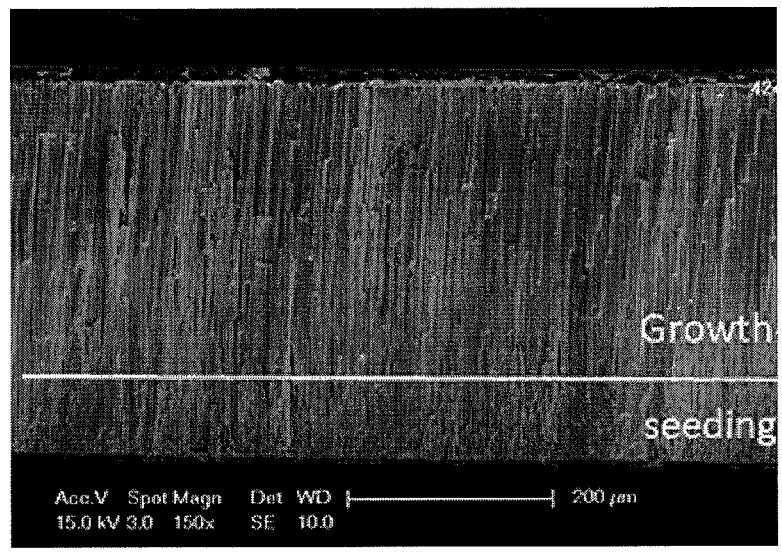
FIG. 4 is a sectional photograph of a scintillator.

Hereinafter, a scintillator according to an embodiment of the present invention will be described in more detail. FIG. 4 is a sectional photograph of a scintillator according to an embodiment of the present invention and FIG. 5 is a partially sectional view of the X-ray detector shown in FIG. 2.

Figure 5:
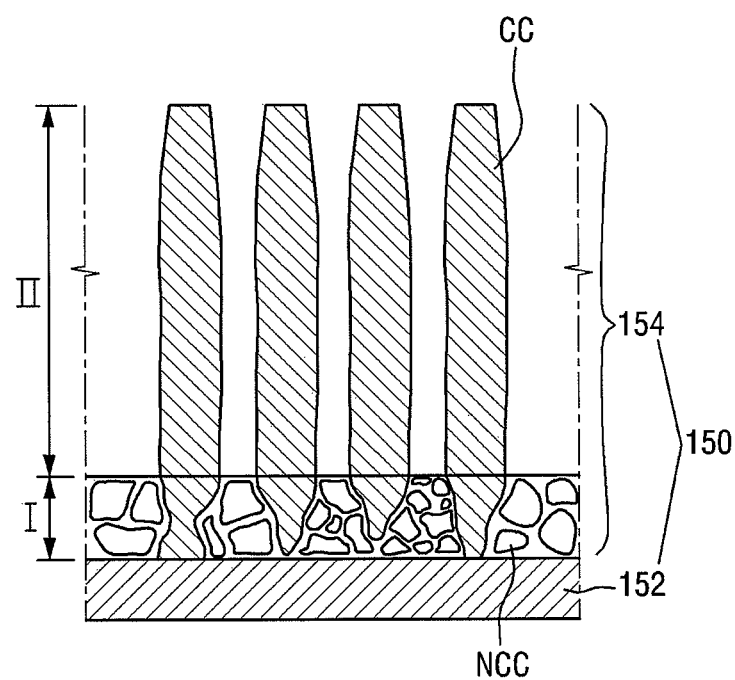
FIG. 5 is a partially sectional view of the X-ray detector shown in FIG. 2.

Referring to FIGS. 4 and 5, the scintillator 150 may include a substrate 152 and a scintillator layer 154 formed on the substrate 152.

The substrate 152 may be formed of a carbon plate, a carbon fiber reinforced plastic (CFRP), a glass substrate, a crystal substrate, a sapphire substrate, a metal sheet, or the like. The metal sheet may be made of, for example, iron, tin, chrome, aluminum, or the like. In some embodiments, the substrate 152 of the scintillator 150 may be a photo diode formed on the X-ray receiving portion or a passivation film formed thereon. In some embodiments, the scintillator 150 may not comprise a substrate 152.

The scintillator layer 154 includes a seed portion I and a growth portion II. The seed portion I is adjacent to the substrate 152 and the growth portion II is adjacent to the seed portion I. A height of the seed portion I is about 5 to 20% of the entire height of the scintillator layer 154. In some embodiments, the height of the seed portion I may be about 10% of the entire height of the scintillator layer 154, and a height of the growth portion II may be about 90% of the entire height of the scintillator layer 154. In some embodiments, the entire height of the scintillator layer 154 may be about 500 μm. Specifically, the height of the seed portion I may be about 50 μm and the height of the growth portion II may be about 450 μm.

The scintillator layer 154 may include columnar crystals (CC) and non-columnar crystals (NCC). The non-columnar crystals NCC may be mainly distributed in the seed portion I. The columnar crystals CC may be distributed in both of the growth portion II and the seed portion I. For example, one of the columnar crystals CC may extend from the seed portion I to the growth portion II. In some embodiments, neighboring columnar crystals CC are spaced apart from each other, which is advantageous for internal total reflection of the columnar crystals CC.

The seed portion I may comprise both columnar crystals CC and the non-columnar crystals NCC distributed therein. However, the growth portion II comprises primarily columnar crystals CC and rarely contain non-columnar crystals NCC.

The columnar crystals CC are shaped to extend in a vertical direction or extending in a direction generally perpendicular to the plane of the substrate 152. The first ends of each of the columnar crystals CC may be disposed to be adjacent to the photoelectric conversion elements 130, such as photo diodes, of the light sensing pixels PXs of the X-ray receiving portion 100. In some embodiments, the first ends of the columnar crystals CC may be positioned in the seed portion I adjacent to the photoelectric conversion elements 130. First ends of a plurality of columnar crystals CC may be disposed to be adjacent to one of the photoelectric conversion elements 130. In the columnar crystal CC, the light may travel along a path ranging from the growth portion II to the seed portion I.

If an aspect ratio of a columnar crystal CC, that is, a ratio of a length to a diameter of the columnar crystal CC, is large, the incident light may be transmitted immediately below without outwardly being diffused or spreading. In other words, a relatively large aspect ratio of the columnar crystal CC is advantageous, and provides for light collimation, which will be described in more detail with reference to FIGS. 6 and 7.

Figure 6:
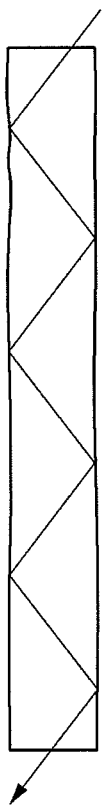
FIGS. 6 and 7 are schematic diagrams illustrating a light path in a scintillator growth portion.
Figure 7:
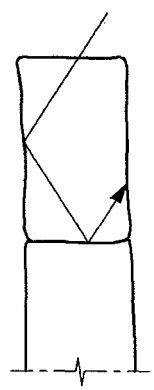

FIGS. 6 and 7 are schematic diagrams illustrating a light path in a scintillator growth portion II.

First, referring to FIG. 6, the columnar crystal CC has a higher refraction index than the ambient air layer. Therefore, if light is incident into the columnar crystal CC, total internal reflection may occur according to the angle of incidence. For example, if the light is incident into a lateral surface of the columnar crystal CC in a greater angle than a critical angle, total internal reflection will result.

FIG. 7 illustrates a case where a first end of one columnar crystal CC and a first end of another columnar crystal CC come into contact with each other. As shown in FIG. 7, if the first end of one columnar crystal CC and the first end of another columnar crystal CC are in contact with each other, the light may be totally internally reflected at the boundary between the columnar crystals CCs. Therefore, the direction of light travel may be changed so that it is not transmitted from one columnar crystal CC to the other.

The case illustrated in FIG. 7 occurs more often when the aspect ratio is small. That is to say, when the aspect ratio of a columnar crystal CC is small, there is a high probability that a plurality of columnar crystals CC which differ from each other are disposed under a particular location. In this case, the light is reflected at a boundary between columnar crystals CCs, so that the light spreads outwardly.

On the other hand, if the aspect ratio of a columnar crystal CC is large, the light continuously travels by total internal reflection in a direction in which the columnar crystals CCs extend and may be transmitted immediately below without outwardly being diffused or spreading. For example, if the height of a columnar crystal CC is substantially equal to the height of the scintillator layer, outward diffusion or spreading of light can be minimized.

In some embodiments, the aspect ratio of the columnar crystal CC may be 80:1 or greater, more specifically 100:1 or greater. In some embodiments, about 70% or greater of columnar crystals CC distributed in the growth portion II may have an aspect ratio of 80:1 or greater. In some embodiments, about 70% or greater of columnar crystals CC distributed in growth portion II may have an aspect ratio of 100:1 or greater. Further, in some embodiments, about 90% or greater of columnar crystals distributed in the growth portion II may have an aspect ratio of 80:1 or greater. In some embodiments, about 90% or greater of columnar crystals CC distributed in growth portion II may have an aspect ratio of 100:1 or greater.

The light collimation may also be related with a diameter of the columnar crystal CC. A diameter of a columnar crystal CC in the seed portion I may be smaller than that of a columnar crystal CC in the growth portion II, which is advantageous for light collimation.

As described above, the growth portion II primarily comprises columnar crystals CC. The seed portion I has the columnar crystals CC and the non-columnar crystals NCC distributed therein. Therefore, for the same width, more columnar crystals are distributed in the seed portion I than in the growth portion II.

Figure 8:
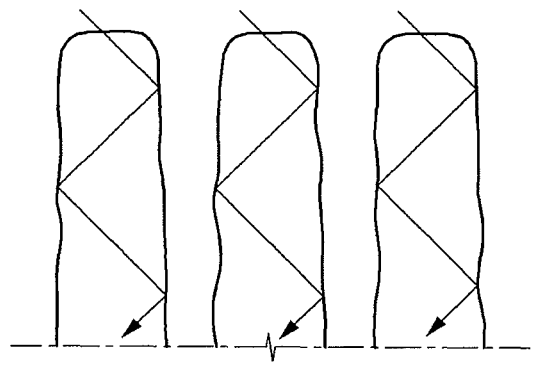
FIGS. 8 and 9 are schematic diagrams illustrating a light path in a scintillator seed portion.
Figure 9:
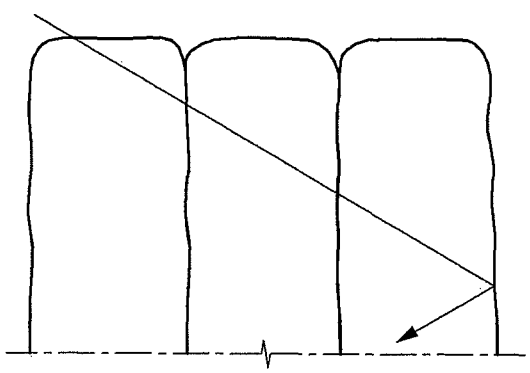

FIGS. 8 and 9 are schematic diagrams illustrating a light path in a scintillator seed portion I. If a large number of columnar crystals exist, there is a high probability that columnar crystals come into contact with each other, which is disadvantageous for light collimation.

FIG. 8 illustrates a case in which crystals have a relatively small diameter and different columnar crystals are spaced apart from each other in a horizontal direction. In this case, since air layers are located in spaces between the spaced-apart columnar crystals, total reflection smoothly occurs within the columnar crystals, exhibiting better light collimation than in the case illustrated in FIG. 8.

FIG. 9 illustrates a case in which columnar crystals have a relatively large diameter and different columnar crystals come into contact with each other in a horizontal direction. In this case, since traveling light may be at least partially transmitted to neighboring columnar crystals, the light may be outwardly diffused or spread.

In the light of foregoing, the columnar crystal CC preferably has a smaller diameter in the seed portion I than in the growth portion II. For a single columnar crystal CC, the diameter of the columnar crystal CC in the seed portion I may be about 0.8 to 0.9 times of that of the columnar crystal CC in the growth portion II.

Next, method of fabricating a scintillator will be described.

First, a substrate and a crucible including a source material (e.g., CsI, NaI, LiF, GOS, etc.) are prepared. The substrate may be formed of a carbon plate, a carbon fiber reinforced plastic (CFRP), a glass substrate, a crystal substrate, a sapphire substrate, a metal sheet, or the like. Alternatively, a photo diode formed on the X-ray receiving portion or a passivation film formed thereon may serve as the substrate of the scintillator.

Next, a seed portion I is formed on the substrate. If the temperature of the crucible is elevated, a vapor cloud of the source material is generated and is then condensed on a surface of the substrate, thereby starting nucleation and growth of crystals.

Here, nucleation and growth may be adjusted by a super-cooling degree. The super-cooling degree may be defined as a difference between the kinetic or thermal energy of the vapor cloud of the source material and the kinetic or thermal energy of the vapor cloud of the condensed source material. The higher the super-cooling degree, the more predominantly the nucleation is achieved, and the lower the super-cooling degree, the more predominantly the growth is achieved.

As described above, a relatively small diameter of the columnar crystal in the seed portion I is advantageous in view of light collimation. If the super-cooling degree is low, growth is facilitated in the seed portion I and the diameter of the columnar crystal is increased. Conversely, if the super-cooling degree is high, nucleation is facilitated in the seed portion I and the diameter of the columnar crystal is decreased or, in other words, the columnar crystal may have a relatively small diameter. Therefore, light collimation can be improved by forming the seed portion I under a condition in which the super-cooling degree is high.

The condition in which the super-cooling degree is high may be created by increasing the temperature of the crucible and decreasing the temperature of the substrate on which the source material is deposited.

After forming the seed portion I and achieving a target height of the seed portion, the growth portion II is formed on the seed portion I.

A method of forming the growth portion II is substantially the same as the method of forming the seed portion I, except for a super-cooling degree condition. If the super-cooling degree is high, nucleation is facilitated, and growth is relatively suppressed. In addition, if nucleation is facilitated, a new nucleus may be created on the existing columnar crystal CC, which is disadvantageous in view of light collimation. Conversely, if the super-cooling degree is low, nucleation is suppressed while growth is facilitated. Accordingly, the columnar crystal CC having a relatively large aspect ratio grows. Therefore, the light collimation can be improved by forming the growth portion II under a condition in which the super-cooling degree is low.

The condition in which the super-cooling degree is low may be created by decreasing the temperature of the crucible and increasing the temperature of the substrate on which the source material is deposited.

Therefore, in some embodiments, the crucible is maintained at a first temperature while the seed portion I is formed, and it is adjusted to and maintained at a second temperature, which is lower than the first temperature, while the growth portion II is formed. In addition, the substrate is maintained at a third temperature while the seed portion I is formed, and it is adjusted to and t maintained at a fourth temperature, which is higher than the third temperature, while the growth portion II is formed.

In some embodiments, one of the crucible temperature and the substrate temperature may be maintained at the same temperature. For example, the crucible may be maintained at the first temperature while the seed portion I is formed, and may be maintained at the second temperature, lower than the first temperature, while the growth portion II is formed. The substrate may be maintained at the same temperature, during formation of both the seed portion I or the growth portion II is formed.

Since the growth portion II is positioned higher than the seed portion I, a process of forming the growth portion II may last longer than a process of forming the seed portion I. In an some embodiments, a process time for forming the growth portion II may be 4 to 20 times of a process time for forming the seed portion I. In some embodiments, the process time for forming the growth portion II may be about 9 times of the process time for forming the seed portion I.

Figure 10:
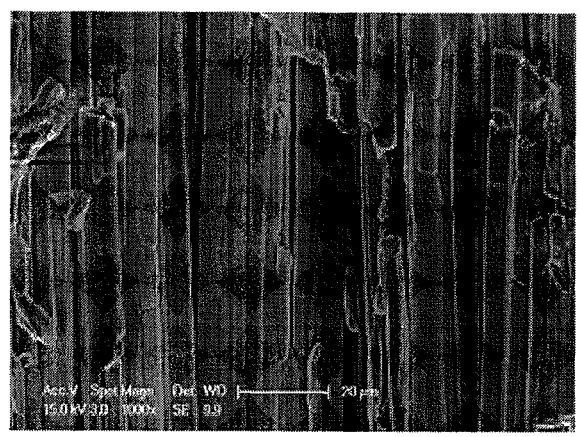
FIG. 10 is a sectional photograph of a scintillator growth portion formed under the condition in which a super-cooling degree is high.
Figure 11:
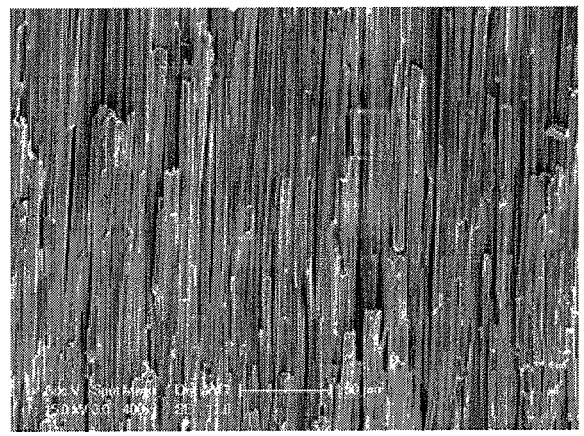
FIG. 11 is a sectional photograph of a scintillator growth portion formed under the condition in which a super-cooling degree is low.

FIG. 10 is a sectional photograph of a scintillator growth portion II formed under the condition in which a super-cooling degree is high, and FIG. 11 is a sectional photograph of a scintillator growth portion II formed under the condition in which a super-cooling degree is low. FIGS. 10 and 11 illustrate formation results of the growth portion II under substantially the same condition. Specifically, FIG. 10 illustrates a crystal where the growth portion II was formed under a high super-cooling degree condition by increasing the crucible temperature, and FIG. 11 illustrates a crystal where the growth portion II was formed under a low super-cooling degree condition by decreasing the crucible temperature.

FIG. 11 depicts a columnar crystal CC having a large aspect ratio resulting from formation in a low super-cooling degree condition.

Figure 12:
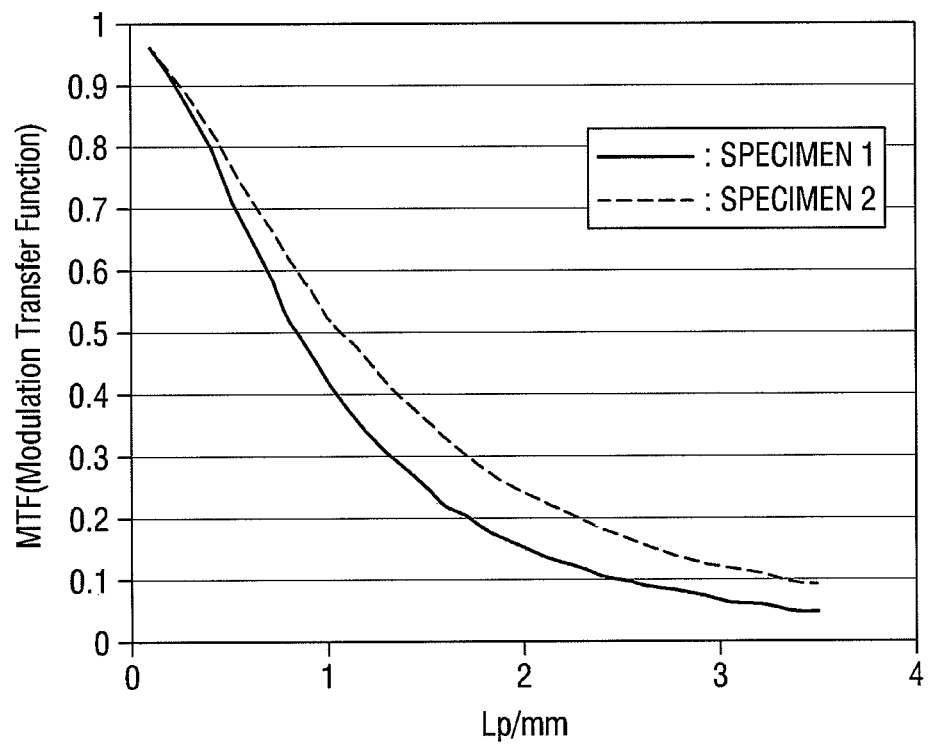
FIG. 12 is a graph illustrating a modulation transfer function according to the resolution for the scintillators shown in FIGS. 10 and 11.

FIG. 12 is a graph illustrating a modulation transfer function according to the resolution for the scintillators shown in FIGS. 10 and 11.

In FIG. 12, a first specimen refers to a scintillator having a growth portion II formed under a high super-cooling degree condition, similar to that depicted in FIG. 10, and a second specimen refers to a scintillator having a growth portion II formed under a low super-cooling degree condition, similar to that depicted in FIG. 11.

Referring to FIG. 12, the second specimen formed under a low super-cooling degree condition has a higher modulation transfer function than the first specimen with the same resolution.

While the present disclosure has referenced exemplary embodiments, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A scintillator comprising:
   a substrate; and
   a scintillator layer formed on the substrate, the scintillator layer having columnar crystals and non-columnar crystals, wherein the scintillator layer includes a seed portion and a growth portion, wherein each of the columnar crystals which extends in the seed portion and the growth portion has a smaller diameter in the seed portion than in the growth portion, and
   wherein each of the columnar crystals has an aspect ratio of 80:1 or greater.

2. The scintillator of claim 1, wherein 70% or greater of the plurality of columnar crystals have an aspect ratio of 100:1 or greater.

3. The scintillator of claim 1, wherein the scintillator layer includes the seed portion adjacent to the substrate and the growth portion adjacent to the seed portion.

4. The scintillator of claim 3, wherein a height of the seed portion comprises about 5 to 20% of the entire height of the scintillator layer.

5. The scintillator of claim 4, wherein the growth portion comprises primarily columnar crystals and the seed portion comprises columnar and non-columnar crystals.

6. The scintillator of claim 1, wherein the diameter of a majority of the columnar crystals in the seed portion is about 0.8 to 0.9 times that the diameter of columnar crystals in the growth portion.

7. A method of fabricating a scintillator, the method comprising:
   preparing a substrate; and
   forming a scintillator layer formed on the substrate, the substrate having columnar crystals, and non-columnar crystals, wherein the scintillator layer includes a seed portion and a growth portion, wherein the majority of the columnar crystals has a smaller diameter in the seed portion than in the growth portion, and
   wherein each of the columnar crystals has an aspect ratio of 80:1 or greater.

8. The method of claim 7, wherein 70% or greater of the columnar crystals have an aspect ratio of 100:1 or greater.

9. The method of claim 7, wherein the forming of the scintillator layer comprises forming the seed portion on the substrate and then forming the growth portion on the seed portion.

10. A method of fabricating a scintillator, the method comprising:
    preparing a substrate;
    placing a source material into a crucible containing the substrate;
    forming a seed portion on the substrate at a first super-cooling degree, wherein the seed portion includes at least non-columnar and columnar crystals; and
    forming a growth portion on the seed portion at a second super-cooling degree which is lower than the first super-cooling degree, wherein the growth portion includes at least columnar crystals,
    wherein columnar crystals in the seed portion have a smaller diameter than the columnar crystals in the growth portion.

11. The method of claim 10, wherein the forming of the seed portion and forming of the growth portion comprise evaporating the source material from the crucible, and condensing the source material on the substrate.

12. The method of claim 11, further comprising evaporating the source material to form the growth portion for approximately 4 to 20 times longer than evaporating the source material to form the seed portion.

13. The method of claim 10, wherein the forming of the seed portion is performed at a first substrate temperature and a first crucible temperature, and the forming of the growth portion is performed at a second substrate temperature, which is higher than the first substrate temperature, and at a second crucible temperature, which is lower than the first crucible temperature.

14. A method of fabricating a scintillator, the method comprising:
    preparing a substrate;
    placing a source material into a crucible;
    depositing the source material on the substrate at a first substrate temperature and a first crucible temperature, wherein the first substrate temperature and first crucible temperature are configured to form a seed portion including at least columnar crystals; and
    subsequently, depositing the source material on the substrate at a second substrate temperature, which is higher than the first substrate temperature, and at a second crucible temperature, which is lower than the first crucible temperature, where the second substrate temperature and second crucible temperature are configured to form a growth portion including at least columnar crystals, and
    wherein the columnar crystals in the seed portion have a smaller diameter than the columnar crystals in the growth portion.

15. An X-ray detector comprising:
    an X-ray receiving portion including a plurality of light sensing pixels;
    a data detector configured to detect an electrical signal transmitted from the X-ray receiving portion; and
    a scintillator disposed on the X-ray receiving portion, the scintillator comprising a substrate and a scintillator layer formed on the substrate the scintillator having columnar crystals and non-columnar crystals, wherein the scintillator layer includes a seed portion and a growth portion, wherein each of the columnar crystals which extends in the seed portion and the growth portion has a smaller diameter in the seed portion than in the growth portion, and
    wherein each of the columnar crystals has an aspect ratio of 80:1 or greater.

16. The X-ray detector of claim 15, wherein 70% or greater of the columnar crystals have an aspect ratio of 100:1 or greater.

17. The X-ray detector of claim 15, wherein the scintillator layer includes a seed portion adjacent to the substrate and a growth portion adjacent to the seed portion.

18. The X-ray detector of claim 15, wherein each of the light sensing pixels includes a photoelectric conversion element and first ends of the columnar crystals are disposed adjacent to the photoelectric conversion elements.

* * * * *